United States Patent [19]

Anao et al.

[11] Patent Number: 4,870,225
[45] Date of Patent: Sep. 26, 1989

[54] MOUNTING ARRANGEMENT OF CHIP TYPE COMPONENT ONTO PRINTED CIRCUIT BOARD

[75] Inventors: Kimiharu Anao; Yoshitsugu Hori, both of Nagaokakyo; Keiichi Shimamaki, Kyoto; Tadashi Sato, Takefu, all of Japan

[73] Assignee: Murata Manufacturing Co., Ltd., Japan

[21] Appl. No.: 331,004

[22] Filed: Mar. 27, 1989

Related U.S. Application Data

[63] Continuation of Ser. No. 139,861, Dec. 30, 1987, abandoned.

[30] Foreign Application Priority Data

Jan. 7, 1987 [JP] Japan .................... 62-001343

[51] Int. Cl.[4] .......................... H05K 1/18; H05K 3/34
[52] U.S. Cl. ................... 174/68.5; 228/180.1; 228/180.2; 361/400; 361/406
[58] Field of Search ............... 174/68.5; 361/400, 403, 361/406; 228/180.1, 180.2

[56] References Cited

U.S. PATENT DOCUMENTS

| | | | |
|---|---|---|---|
| 2,898,519 | 8/1959 | Foster | 174/68.5 X |
| 3,373,481 | 3/1968 | Lins et al. | 228/180.2 X |
| 3,429,040 | 2/1969 | Miller | 174/68.5 X |
| 3,439,416 | 4/1969 | Yando | 29/625 |
| 3,447,038 | 5/1969 | Liben | 174/68.5 X |
| 3,495,133 | 2/1970 | Miller | 174/68.5 X |
| 3,842,190 | 10/1974 | Towell | 174/68.5 |
| 4,010,488 | 3/1977 | Gruszka | 357/70 |
| 4,164,778 | 8/1979 | Sawairi et al. | 361/409 |
| 4,195,195 | 3/1980 | Miranda | 174/68.5 |
| 4,417,296 | 11/1983 | Schelhorn | 361/386 |
| 4,437,141 | 3/1984 | Prokop | 174/68.5 X |
| 4,565,314 | 1/1986 | Scholz | 228/180.2 |
| 4,645,114 | 2/1987 | Brekel et al. | 228/180.2 X |
| 4,695,927 | 9/1987 | Barre | 361/400 |

FOREIGN PATENT DOCUMENTS

| | | | |
|---|---|---|---|
| 0153951 | 2/1982 | German Democratic Rep. | 228/180.1 |
| 2113134 | 8/1983 | United Kingdom | 228/180.1 |

Primary Examiner—R. R. Kucia
Attorney, Agent, or Firm—Ostrolenk, Faber, Gerb & Soffen

[57] ABSTRACT

A mounting arrangement of a chip type component onto a printed circuit board, which includes a chip type component having terminal electrodes at its opposite end portions, and land portions provided on a printed circuit board so as to fix the chip type component on them by soldering through cream type solder applied onto the land portions. The land portions are each formed to have such a length as will not project externally in a longitudinal direction of the chip type component.

8 Claims, 3 Drawing Sheets

MOUNTING ARRANGEMENT OF CHIP TYPE COMPONENT ONTO PRINTED CIRCUIT BOARD

This is a continuation of application Ser. No. 139,861 filed on Dec. 30, 1987, now abandoned.

BACKGROUND OF THE INVENTION

The present invention generally relates to mounting of electronic components, and more particularly, to a mounting arrangement of a chip type component onto a printed circuit board, in which a chip type component having terminal electrodes at its end portions, such as a chip type multi-layer ceramic capacitor, chip type resistor or the like, is fixed by soldering it onto land portions on a printed circuit board, through cream type solder applied onto said land portions.

Commonly, a chip type component 4 such as the chip type multi-layer ceramic capacitor, chip type resistor, or the like as referred to above, includes, as shown in FIG. 4, a chip type component main body 1 in a rectangular cubic box-like configuration, and terminal electrodes 2 and 3 provided at opposite end portions of said main body 1 and, each extending from the end face of the main body 1 and across the side faces thereof neighboring said end face. These terminal electrodes 2 and 3 are intended to be directly soldered onto land portions of a printed circuit board when said chip type component is actually mounted onto said printed circuit board.

Conventionally, as shown in FIGS. 5 and 6, land portions 5 and 6 are formed on the printed circuit board P on which the chip type component 4 as in FIG. 4 is to be actually mounted, each having a size larger than an area of a portion where the terminal electrode 2 or 3 of the chip type component 4 overlaps the printed circuit board P, and the terminal electrodes 2 and 3 of the chip type component 4 are soldered onto said land portions 5 and 6. More specifically, with the cream type solder 7 applied over the land portions 5 and 6, said cream type solder 7 is melted again through heating, and by reflow soldering, for soldering the terminal electrodes 2 and 3 onto said land portions 5 and 6, such terminal electrodes 2 and 3 are respectively soldered onto the land portions 5 and 6.

A problem occurs in the case where the terminal electrodes 2 and 3 of the chip type component 4 are to be soldered to the printed circuit board P, having the land portions 5 and 6 as described above, by reflow soldering. The problem is that the chip type component 4 is undesirably floated or raised away from the printed circuit board in the process in which the cream type solder 7 is heated so as to be re-melted, before it is then solidified. The causes for giving rise to the above problem may be attributable to such factors, as the dimensions of the land portions 5 and 6 not being proper with respect to those of the terminal electrodes 2 and 3 of the chip type component 4; or the heat given to the cream type solder 7 applied over the land portions 5 and 6 during the reflow soldering not being uniform; or the amount of the applied cream type solder being different between the land portions 5 and 6; or a shift in the position of the chip type component 4 as compared with the cream type solder 7, etc.

By way of example, in the case where the sizes of the land portions 5 and 6 are large with respect to the sizes of the terminal electrodes 2 and 3 of the chip type component 4, surface tensions F1 and F2 acting on the terminal electrodes 2 and 3 of the chip type components 4, due to the cream type solder melted by heating, have component forces F11 and F21 acting perpendicularly to the opposite end faces of the chip type component 4 and directed away from said chip type component 4 as shown in FIG. 7. Thus, when a difference is produced between the above forces F11 and F21 due to a difference in the amount of the cream type solder 7 to applied with respect to the land portions 5 and 6, or due to a non-uniformity in heating the cream type solder 7, etc., a moment Mp tending to rotate the chip type component 4 in the direction, indicated by the arrow A1 about a corner portion B of the terminal electrode 2 acts on said chip type component 4. If this moment Mp exceeds a moment Mw due to the weight of the chip type component 4, then such floating or rising of said chip type component 4 takes place as described above. Therefore, such floating or rising occurs more frequently in a small sized chip type component with a light weight.

SUMMARY OF THE INVENTION

Accordingly, an object of the present invention is to provide a mounting arrangement of a chip type component onto a printed circuit board, which is arranged to prevent floating or rising of the chip type component with respect to a pattern surface of the printed circuit board due to surface tension of molten cream type solder during reflow soldering.

Another important object of the present invention is to provide a mounting arrangement of the above described type, which can be readily introduced into a production line for a mass production at low cost.

In accomplishing these and other objects, according to one preferred embodiment of the present invention, there is provided a mounting arrangement of a chip type component onto a printed circuit board, which includes a chip type component having terminal electrodes at its opposite end portions, and land portions provided on a printed circuit board, onto which the chip type component is fixed by soldering with cream type solder applied onto the land portions, and is characterized in that said land portions are each formed to have such a length as will not project externally in a longitudinal direction of said chip type component. By the above construction, the force due to the surface tension of the molten cream type solder which causes the chip type component to float or rise during melting of the solder does not act on the opposite end faces of the chip type component.

According to the present invention, since the cream type solder adhering to the land portions does not protrude beyond or onto the end face of the chip type component, no force of surface tension of the solder acts in a direction perpendicular to the end face of the chip type component which may cause the chip type component to float or rise during melting of the cream type solder, and therefore, such undesirable floating or rising of the chip type component during the reflow soldering may be perfectly prevented, whereby the mounting of the chip type component onto the printed circuit board can be positively effected without additional corrections, etc.

BRIEF DESCRIPTION OF THE DRAWINGS

These and other objects and features of the present invention will become apparent from the following description of preferred embodiments thereof with reference to the accompanying drawings, in which.

DETAILED DESCRIPTION OF THE INVENTION

Figure 1:
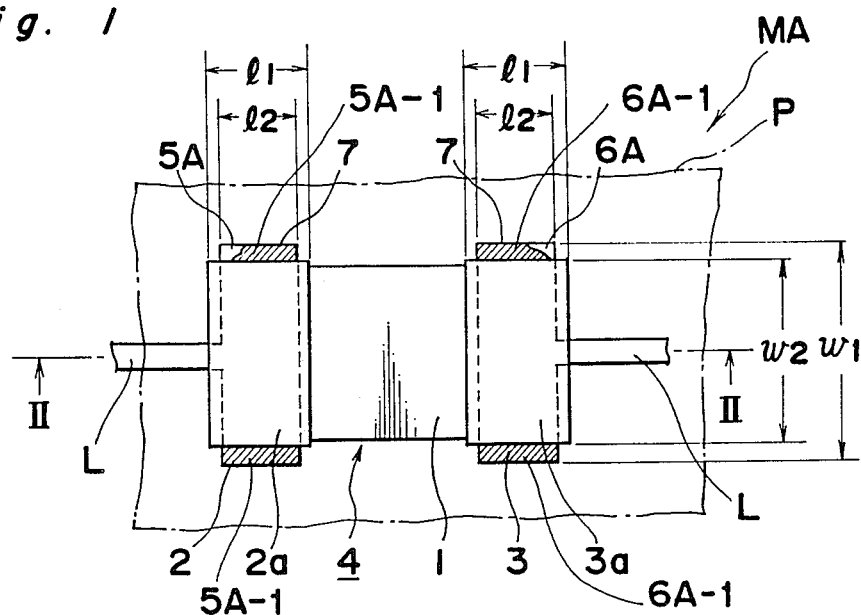
FIG. 1 is a fragmentary top plan view of a mounting arrangement of a chip type component onto a printed circuit board according to one preferred embodiment of the present invention, for explaining the construction of land portions on the printed circuit board onto which the chip type component is soldered.

Before the description of the present invention proceeds, it is to be noted that like parts are designated by like reference numerals throughout the accompanying drawings.

Figure 2:
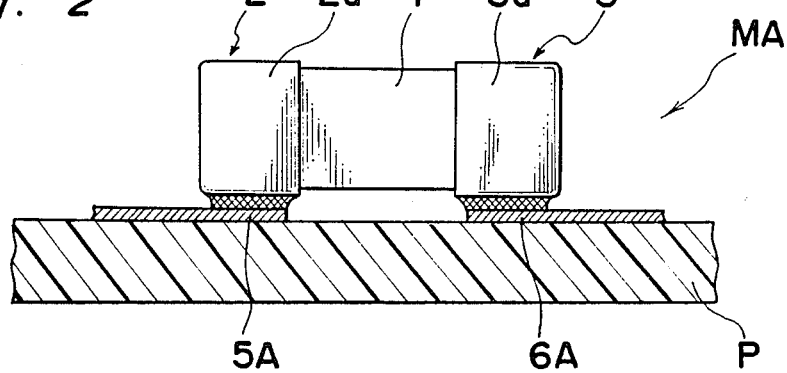
FIG. 2 is a cross section taken along the line II—II in FIG. 1.

Referring now to the drawings, there is shown in FIGS. 1 and 2, a mounting arrangement MA of a chip type component onto a printed circuit board according to one preferred embodiment of the present invention.

Figure 5:
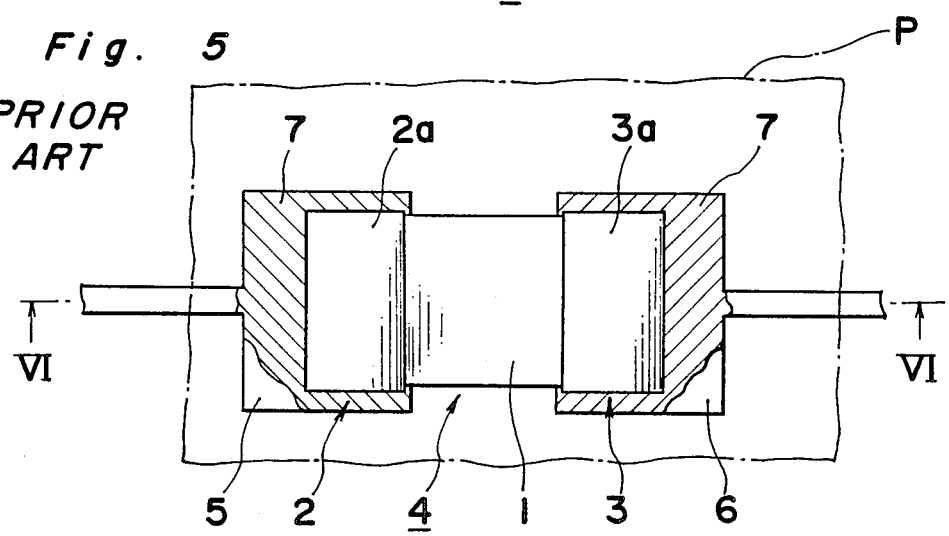
FIG. 5 is a fragmentary top plan view of a conventional mounting arrangement of a chip type component onto a printed circuit board (already referred to)
Figure 6:
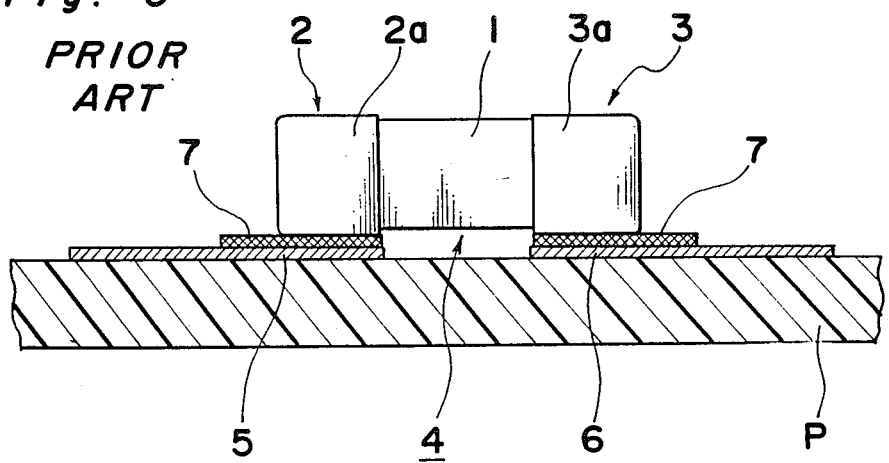
FIG. 6 is a cross section taken along the line VI—VI in FIG. 5 (already referred to), and FIG. 7 a cross sectional diagram for explaining forces on the chip type component in the construction of the lands in FIG. 5 (already referred to).
Figure 7:
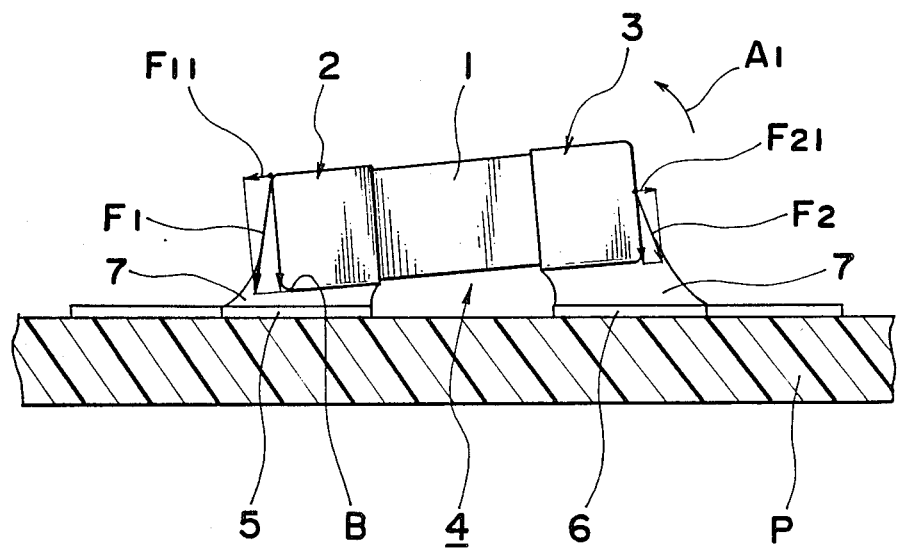

The mounting arrangement MA of the present invention shown in FIGS. 1 and 2 includes a chip type component 4 having terminal electrodes 2 and 3 at its opposite end portions, and land portions 5A and 6A provided on a printed circuit, board P to which the chip type component 4 is to be fixed by soldering by means of cream type solder 7 applied onto the land portions 5A and 6A. The solder is applied generally in the similar manner as explained earlier with reference to the conventional mounting arrangement of FIGS. 5 and 6. However, in the embodiment of FIGS. 1 and 2, the land portions 5A and 6A are formed to have such a length as will not project externally in a longitudinal direction of said chip type component except for lead-out portions L thereof. Meanwhile, each of said land portions 5A and 6A is adapted to extend or protrude outwardly to a certain extent from opposite sides of the terminal electrodes 2 and 3 in a widthwise direction of said chip type component 4 as shown by hatched portions 5A-1 and 6A-1 in FIG. 1, and thus, the width W1 of each of the land portions 5A and 6A is set to be somewhat larger than the width W2 of each of the terminal electrodes 2 and 3 of the chip type component 4. Furthermore, the length $l_2$, of each of the land portions 5 and 6 narrower with respect to a length $l_1$ of each of the extended portions 2a and 3a of the terminal electrodes 2 and 3 extending from the end faces of the chip type component main body 1 and partially over the side faces of said main body 1. That is, the lengths of the extended portions 2a and 3a are the same as the lengths of each of the terminal electrodes 2 and 3 as observed in the longitudinal direction of the chip type component main body 1. As just mentioned, the lengths of the land portions and the terminal electrodes are set to be in a relation $l_2 < l_1$.

In the construction as described above, there is no possibility that the cream type solder 7 adhering to the land portions 5 and 6 protrudes towards the end face side of the chip type component main body 1 so as to adhere to the terminal electrodes 2 and 3 on said end faces. Therefore, during the reflow soldering, there is no force of surface tension acting perpendicularly to the end face of the chip type component main body 1, and accordingly, no moment due to the surface tension of the solder, which might have caused the chip type component 4 to float or rise upon melting of the cream type solder 7, acts on the end faces of the chip type component 4. Consequently, the undesirable floating and rising of the chip type component 4 during the reflow soldering may be advantageously prevented.

It is to be noted here that in the above embodiment, the value of $l_2/l_1$ is closely related to running (or capillary action) of the cream solder 7 during preheating, and the length $l_2$ for each of the land portions 5A and 6A with respect to each of the length $l_1$ of the extended portions 2a and 3a of the terminal electrodes 2 and 3 should preferably be set at about $l_2/l_1 = 0.6$ to 0.8.

It should also be noted that, when the land portions 5A and 6A are adapted to protrude externally in the widthwise direction of the chip type component 4 as at 5A-1 and 6A-1 in FIG. 1, there is such an advantage that the condition of the soldering connection can be visually inspected after the reflow soldering, with the hatched portions 5A-1 and 6A-1 thus serving as the soldering checking portions.

Figure 3:
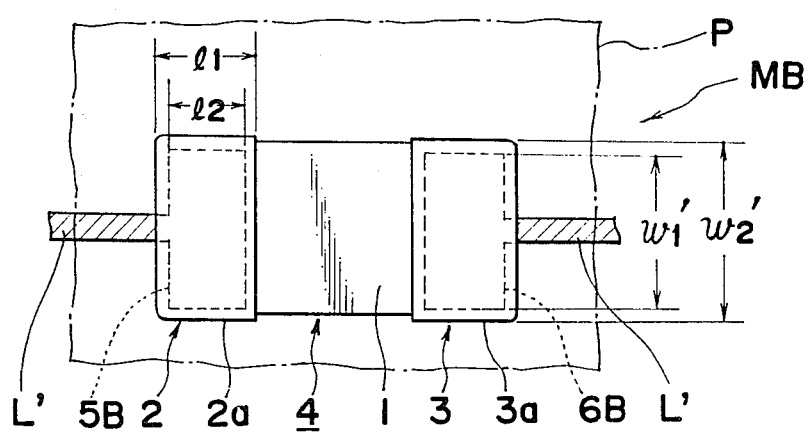
FIG. 3 is a view similar to FIG. 1, which particularly shows a modification thereof.
Figure 4:
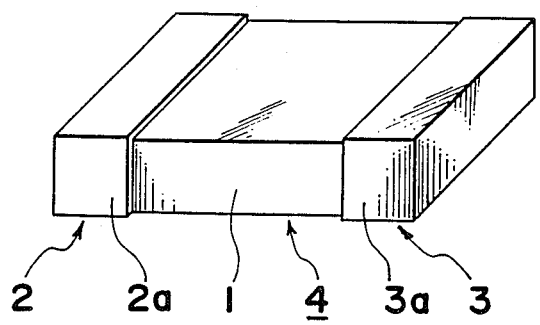
FIG. 4 is perspective view of one example of a chip component (already referred to)

Referring further to FIG. 3, there is shown a modification of the mounting arrangement MA in FIGS. 1 and 2.

In the modified mounting arrangement MB of FIG. 3 the land portions 5A and 6A in the embodiment of FIGS. 1 and 2 are replaced by land portions 5B and 6B each having a width W1' set to be smaller than the width W2' of each of the terminal electrodes 2 and 3 of the chip type component 4, while other construction and effect are generally similar to those of the embodiment of FIGS. 1 and 2, with like parts being designated by like reference numerals for brevity of description.

In the above mounting arrangement MB, the lead-out portions L' for the land portions 5B and 6B represented by hatching may be applied with solder-resist, but such lead-out portions may also be utilized for checking of soldering without application of any solder-resist.

It is to be further noted that in the arrangements MA and MB in FIGS. 1 to 3, the side of the land portion 5 which faces the land portion 6, or the side of the land portion 6 which faces the land portion 5, may be located between the ends of the extended portions 2a and 3a of the terminal electrodes 2 and 3 extending from the end faces of the chip type component main body 1 to the side faces thereof, beyond such ends of the extended portions.

Although the present invention had been fully described by way of example with reference to the accompanying drawings, it is to be noted here that various changes and modifications will be apparent to those skilled in the art. Therefore, unless other wise such changes and modifications depart from the scope of the present invention, they should be construed as included therein.

What is claimed is:

1. A mounting arrangement comprising
   a chip type component mounted onto a printed circuit board, said chip type component having a length defining a longitudinal direction and having terminal electrodes at its opposite end portions, said terminal electrodes including end faces and further including extended portions which extend from said end faces onto lateral surfaces of said component adjacent said end faces, and land portions being provided on said printed circuit board, the chip type component being fixed directly thereon and held thereon exclusively by a predetermined quantity of cream type solder applied onto said land portions, said land portions being each formed to have such a length that said land portions will not project outwardly beyond said terminal electrodes in said longitudinal direction of said chip type component.

2. A mounting arrangement as claimed in claim 3, wherein each of said land portions extends outwardly to a predetermined extent from opposite sides of the terminal electrodes in a widthwise direction of said chip type component, with a width of each of the land portions being greater than a corresponding width of each of the terminal electrodes of said chip type component.

3. A mounting arrangement as claimed in claim 1, wherein a length $l_2$ of each of said land portions is less than a corresponding length $l_1$ of each of said extended portions of said terminal electrodes in the longitudinal direction of said chip type component main body;

the ratio $l_2/l_1$ being selected according to the quantity and the molten viscosity of the cream type solder, and according to the capillary action between the terminal electrodes and the land portions, such that when molten, said cream type solder does not run onto said end faces of said chip type components.

4. A mounting arrangement as claimed in claim 3, wherein a width of each of the land portions is less than a corresponding width of each of the terminal electrodes of said chip type component.

5. A mounting arrangement as claimed in claim 3, wherein said ratio $l_2/l_1$ is in the range of about 0.6 to about 0.8.

6. A method of mounting a chip type component onto a printed circuit board, wherein said chip type component has a length defining a longitudinal direction and has terminal electrodes at its opposite end portions, said terminal electrodes including end faces and further including extended portions which extend from said end faces onto lateral surfaces of said component adjacent said end faces, and wherein land portions are provided on said printed circuit board, the method comprising the steps of:

fixing the chip type component directly on said land portions and holding it thereon exclusively by applying a predetermined quality of cream type solder applied onto said land portions, and forming each of said land portions to have such a length that said land portions will not project outwardly beyond said terminal electrodes in said longitudinal direction of said chip type component.

7. A method as claimed in claim 6, wherein said land portions are formed so that a length $l_2$ of each of said land portions is less than a corresponding length $l_1$ of each of said extended portions of said terminal electrodes in the longitudinal direction of said chip type component main body; and the ratio $l_2/l_1$ is selected according to the quantity and the molten viscosity of the cream type solder, and according to the capillary action between the terminal electrodes and the land portions, such that when molten, said cream type solder does not run onto said end faces of said chip type components.

8. A method as claimed in claim 7, wherein said ratio $l_2/l_1$ is in the range of about 0.6 to about 0.8.

* * * * *